United States Patent
Ji

(10) Patent No.: US 11,863,179 B2
(45) Date of Patent: Jan. 2, 2024

(54) VOLTAGE CONVERSION CIRCUIT

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 79 days.

(21) Appl. No.: 17/688,989

(22) Filed: Mar. 8, 2022

(65) Prior Publication Data
US 2022/0294446 A1      Sep. 15, 2022

(30) Foreign Application Priority Data

Mar. 9, 2021   (CN) .................. 202110256173.X

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ... H03K 19/018507; H03K 19/018521; H03K 19/01855
See application file for complete search history.

(56) References Cited

U.S. PATENT DOCUMENTS

| 2003/0076149 A1 | 4/2003 | Haga |
| 2004/0150607 A1 | 8/2004 | Nakajima |
| 2005/0206432 A1* | 9/2005 | Tobita ................... G09G 3/20 327/333 |
| 2013/0249595 A1 | 9/2013 | Ogawa |
| 2015/0244266 A1* | 8/2015 | Tsukuda ......... H03K 19/018521 323/271 |

FOREIGN PATENT DOCUMENTS

| CN | 1295875 C | 1/2007 | |
| CN | 103325419 B | 5/2017 | |
| EP | 369405 A * | 5/1990 | ......... G06F 13/4072 |

* cited by examiner

*Primary Examiner* — Patrick O Neill
(74) *Attorney, Agent, or Firm* — Cooper Legal Group, LLC

(57) ABSTRACT

A voltage conversion circuit is provided. The circuit includes a first input module and a second input module. The first input module is connected to a first voltage and has a first input terminal for receiving an input signal and outputting a conversion signal, a high level of the input signal is a second voltage which is less than the first voltage; The second input module is connected to the first input module and has a second input terminal and an output terminal, the second input terminal is configured to receive a sampling signal, and the second input module is configured to sample the conversion signal according to the sampling signal and output an output signal via the output terminal.

10 Claims, 8 Drawing Sheets

VOLTAGE CONVERSION CIRCUIT

CROSS-REFERENCE TO RELATED APPLICATION

This application is based on and claims priority to Chinese Patent Application No. 202110256173.X, filed on Mar. 9, 2021, the disclosure of which is hereby incorporated by reference in its entirety.

BACKGROUND

In order to reduce power consumption of memory chips, in a low-speed mode, operating voltage of some circuits can be lowered to reduce the power consumption of the circuits. At this time, operating voltage of other circuits will be higher than the operating voltage of these circuits. When a signal is transmitted from other circuits to these circuits having lowered voltage, the signal can be used directly, but when the signal is transmitted from these circuits having lowered voltage to other circuits, it is usually needed to boost the signal, otherwise leakage will occur.

In the related art, a level shifter is usually used to boost the signal. When there are many interface signals between these circuit having lowered voltage and other circuits, it is needed to set a voltage shifter for each signal. The component occupies a large space and the total power consumption of a plurality of voltage shifters is larger. Therefore, there is a need for a voltage conversion scheme with low power consumption and small component occupied area.

It is to be noted that the information disclosed in the above Background section is only for better understanding of the background of the present disclosure, and therefore may contain information that does not form the prior art that has already been known to a person of ordinary skill in the art.

SUMMARY

The present disclosure relates to the technical field of integrated circuits, and in particular, to a voltage conversion circuit capable of converting a low-voltage input signal into a high-voltage output signal.

According to a first aspect of the present disclosure, there is provided a voltage conversion circuit. The circuit includes a first input module and a second input module. The first input module is connected to a first voltage and has a first input terminal for receiving an input signal and outputting a conversion signal, a high level of the input signal is a second voltage which is less than the first voltage. The second input module is connected to the first input module and has a second input terminal and an output terminal, the second input terminal is configured to receive a sampling signal, and the second input module is configured to sample the conversion signal according to the sampling signal and output an output signal via the output terminal.

It is to be understood that the above general description and the following detailed description are exemplary and explanatory only and are not intended to limit the present disclosure.

BRIEF DESCRIPTION OF THE DRAWINGS

The accompanying drawings, which are incorporated in and constitute a part of this specification, illustrate embodiments consistent with the present disclosure and together with the description serve to explain the principles of the present disclosure. It is apparent that the drawings in the following description are only some embodiments of the present disclosure, and for a person of ordinary skill in the art, other drawings can also be obtained from these drawings without any creative effort.

DETAILED DESCRIPTION

Figure 1:
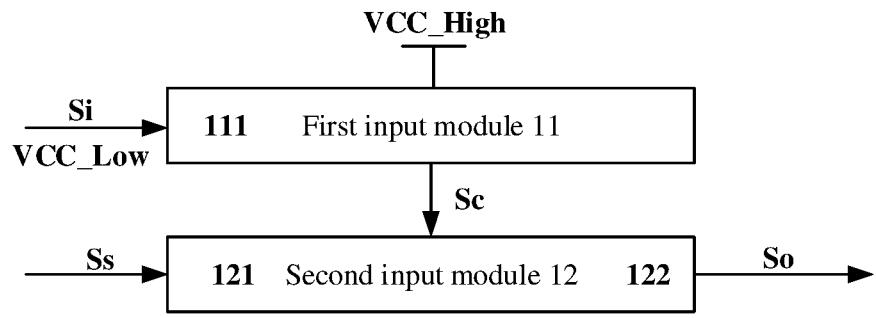
FIG. 1 illustrates a schematic diagram of a voltage conversion circuit in an exemplary embodiment of the present disclosure.

Exemplary implementations will now be described more fully with reference to the accompanying drawings. Exemplary implementations, however, can be embodied in various forms and should not be construed as limitation to the examples set forth herein; rather, these implementations are provided so that the present disclosure will be thorough and complete, and will fully convey the concept of exemplary implementations to a person skilled in the art. The described features, structures, or characteristics may be combined in any suitable manner in one or more implementations. In the following description, numerous specific details are provided in order to give a thorough understanding of the implementations of the present disclosure. However, a person skilled in the art would appreciate that the technical solutions of the present disclosure may be practiced without one or more of the specific details, or other methods, components, apparatuses, steps, etc. may be employed. In other instances, well-known solutions have not been shown or described in detail to avoid obscuring aspects of the present disclosure.

In addition, the accompanying drawings are merely schematic illustrations of the present disclosure, and the same reference numerals in the drawings denote the same or similar parts, and thus their repeated descriptions will be omitted. Some of the block diagrams illustrated in the figures are functional entities that do not necessarily correspond to physically or logically separate entities. These functional entities may be implemented in software, or in one or more hardware modules or integrated circuits, or in different networks and/or processor apparatuses and/or microcontroller apparatuses.

The exemplary implementations of the present disclosure will be described in detail below with reference to the accompanying drawings.

FIG. 1 illustrates a schematic diagram of a voltage conversion circuit in an exemplary embodiment of the present disclosure.

With reference to FIG. 1, the voltage conversion circuit 100 may include a first input module 11 and a second input module 12.

The first input module 11 is connected to a first voltage VCC_High and has a first input terminal 111 which is configured to receive an input signal Si and output a conversion signal Sc, a high level of the input signal Si is a second voltage VCC_Low which is less than the first voltage VCC_High.

The second input module 12 is connected to the first input module 11 and has a second input terminal 121 and an output terminal 122, the second input terminal 121 is configured to receive a sampling signal Ss, and the second input module 12 samples the conversion signal Sc according to the sampling signal Ss to output an output signal So via the output terminal 122.

In an embodiment of the present disclosure, the first input module 11 operates at the first voltage VCC_High, and therefore, the conversion signal Sc generated according to the input signal Si is a signal at the first voltage VCC_High, and the conversion signal Sc is sampled by the second input module 12, an output signal at the first voltage VCC_High can be output, so as to realize boosting of the voltage of the input signal Si.

In an embodiment of the present disclosure, the enable level of the sampling signal Ss may appear within a preset time period during which the level of the input signal Si changes, that is, the sampling signal Ss may be triggered by the polarity variation of the input signal Si, so that the timing of the output signal So is made to be consistent with timing of the input signal Si.

In another embodiment of the present disclosure, the sampling signal Ss may also be a pulse signal with a predetermined cycle, so that the aperiodic input signal Si is converted into a periodic output signal So, so that the timing of the signal is easier to be controlled. The input signals having different timings can be processed to form a signal group having the same timing through the processing of the sampling signal, facilitating the use of subsequent circuits.

In another embodiment of the present disclosure, the sampling signal Ss may also be used to sample the input signal Si according to the control signal.

With a simple structure, the voltage conversion circuit 100 provided by the embodiments of the present disclosure can be implemented with fewer components, which greatly reduces the occupied area and the power consumption of the components having the voltage conversion function.

Figure 2:
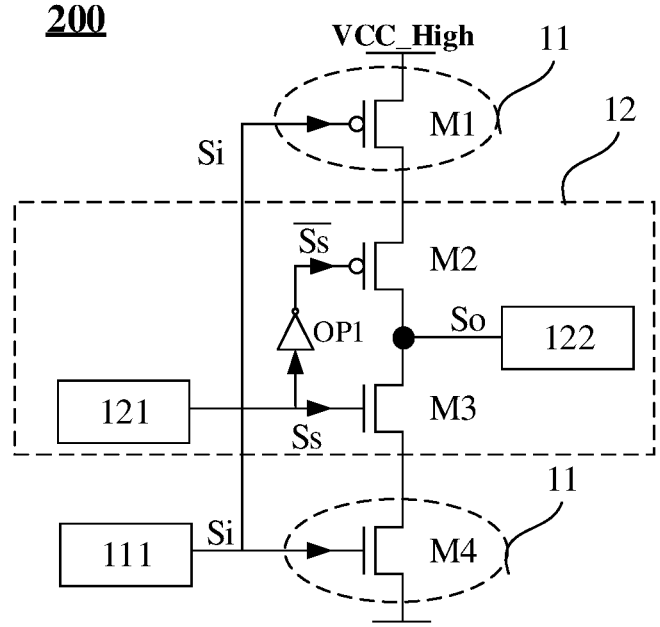
FIG. 2 illustrates a circuit diagram of a voltage conversion circuit in an embodiment of the present disclosure.

FIG. 2 illustrates a circuit diagram of a voltage conversion circuit in an embodiment of the present disclosure.

With reference to FIG. 2, in the voltage conversion circuit 200, the first input module 11 may include a first P-type transistor M1 and a first N-type transistor M4.

The gate of the first P-type transistor M1 is connected to the first input terminal 111, and the source of the first P-type transistor M1 is connected to the first voltage VCC_High.

The gate of the first N-type transistor M4 is connected to the first input terminal 111 and the source of the first N-type transistor M4 is grounded.

The second input module 12 may include a second P-type transistor M2 and a second N-type transistor M3.

The gate of the second P-type transistor M2 is electrically connected to the second input terminal 121, the source of the second P-type transistor M2 is connected to the drain of the first P-type transistor M1, and the drain of the second P-type transistor M2 is connected to the output terminal 122.

The gate of the second N-type transistor M3 is electrically connected to the second input terminal 121, the source of the second N-type transistor M3 is connected to the drain of the first N-type transistor M4, and the drain of the second N-type transistor M3 is connected to the output terminal 122.

In an embodiment illustrated in FIG. 2, the second input module 12 further includes a first inverter OP1.

In an embodiment, an enable level of the sampling signal Ss is a high level, the gate of the second P-type transistor M2 is connected to the second input terminal 121 (as illustrated in FIG. 2) via the first inverter, and the gate of the second N-type transistor M3 is connected to the second input terminal 121.

In another embodiment, an enable level of the sampling signal Ss is a low level, the gate of the second P-type transistor M2 is connected to the second input terminal 121 (not illustrated), and the gate of the second N-type transistor M3 is connected to the second input terminal 121 via the first inverter.

The operating principle of the voltage conversion circuit of the embodiment illustrated in FIG. 2 will be described below by controlling the timing.

Figure 3:
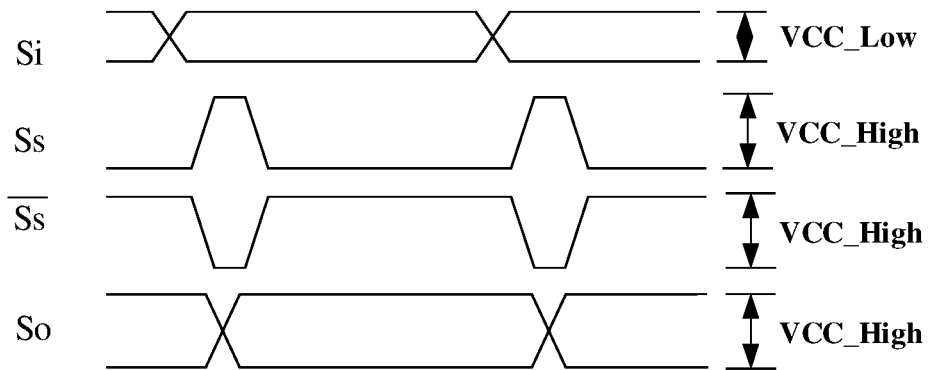
FIG. 3 illustrates a timing control diagram in the embodiment illustrated in FIG. 2.

FIG. 3 illustrates a timing control diagram in the embodiment illustrated in FIG. 2.

In the embodiment illustrated in FIG. 3, the input signal Si is a periodic signal, and the sampling signal Ss is also a periodic signal. The sampling signal Ss appears in the preset time period during which the input signal Si undergoes a level conversion, and the level of the output signal So changes with the occurrence of the sampling signal Ss. It can be seen that the level variation range of the input signal Si is the second voltage VCC_Low, and the level variation ranges of the sampling signal Ss, the inversion signal Ss of the sampling signal Ss after passing the first inverter OP1, and the level variation ranges of the output signal So are all the first voltage VCC_High.

FIGS. 4A to 4D illustrate schematic diagrams of equivalent circuits of the voltage conversion circuit illustrated in FIG. 2 under the control of the timing illustrated in FIG. 3.

Figure 4A:
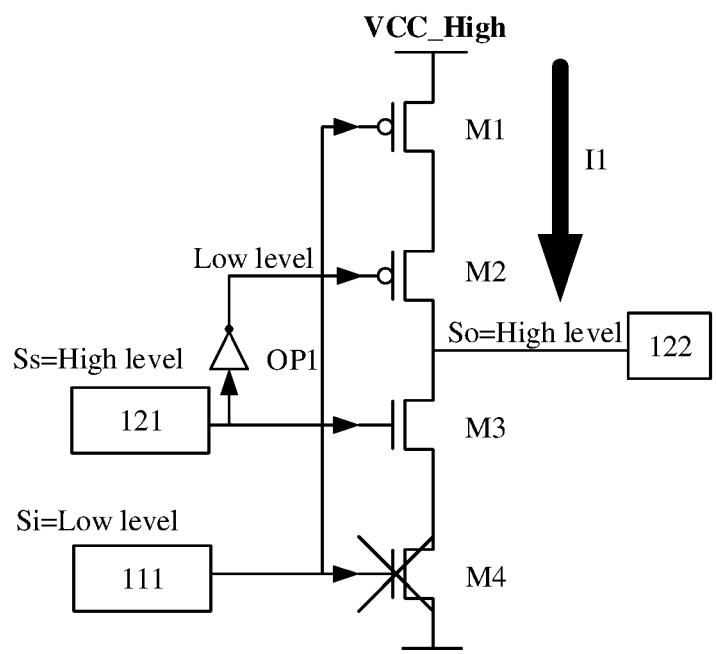
FIGS. 4A to 4D illustrate schematic diagrams of equivalent circuits of the voltage conversion circuit illustrated in FIG. 2 under the control of the timing illustrated in FIG. 3.

With reference to FIG. 4A, when the input signal Si is at a low level and the sampling signal Ss is at a high level, the first P-type transistor M1, the second P-type transistor M2, and the first N-type transistor M3 are conducted, and the second N-type transistor M4 is turned off. At this time, the first voltage VCC_High is output to the output terminal 122 through the first P-type transistor M1 and the second P-type transistor M2 to generate the current IL so that the output signal So is VCC_High, that is, a high level.

Figure 4B:
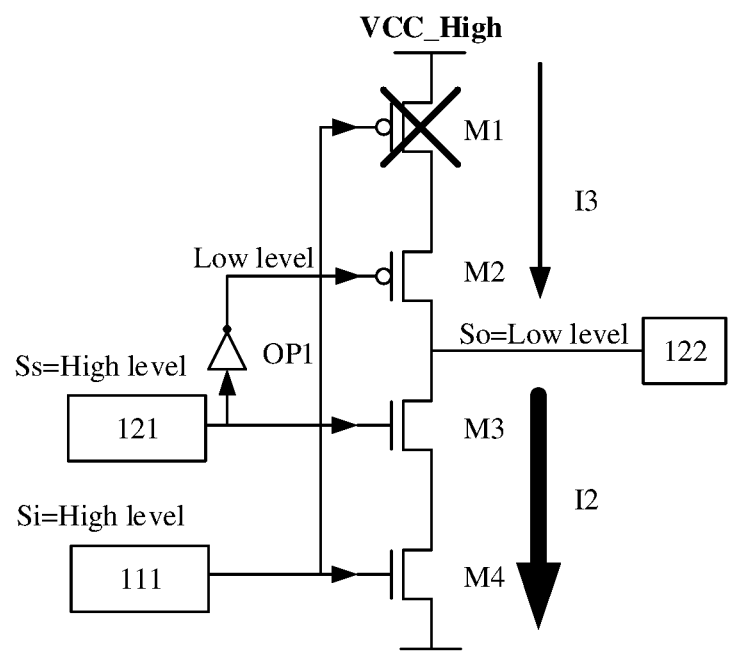

With reference to FIG. 4B, when the input signal Si is a high level and the sampling signal Ss is at a high level, the second P-type transistor M2, the first N-type transistor M3, and the second N-type transistor M4 are conducted, and the first P-type transistor M1 is turned off (or at least the pull-up capability of the first P-type transistor M1 is less than the pull-down capability of the second N-type transistor M4). At this time, the output terminal 122 is grounded through the first N-type transistor M3 and the second N-type transistor M4, and the discharging current I2 is generated, so that the output signal So is 0, that is, the output signal So is at a low level. It can be understood that, the high level of the input signal Si is VCC_Low, and VCC_Low is smaller than VCC_High, for example, VCC_Low is 0.9V and VCC_High is 1.1V, and therefore, the first P-type transistor M1 may not be completely turned off, and there will be certain charging current I3, the charging current I3 flows from VCC_High to the output terminal 122, and the discharging current I2 flows from the output terminal 122 to the ground terminal.

In order to make the charging current I3 much smaller than the discharging current I2, so that the output signal So of the output terminal 122 reaches 0V, in an embodiment of the present disclosure, the value of the second voltage VCC_Low needs to make the pull-up capability of the first P-type transistor M1 smaller than the pull-down capability of an N-type transistor M4. In an exemplary embodiment of the present disclosure, the difference between the first voltage VCC_High and the second voltage VCC_Low may be, for example, less than or equal to the threshold voltage Vp1 of the first P-type transistor M1, and the value of Vp1 may be, for example, 0.5V.

It can be seen from the embodiments illustrated in FIGS. 4A and 4B, the voltage conversion circuit 200 can convert the input signal Si with a lower voltage variation range (VCC_Low to 0) into an output signal with a higher voltage variation range (VCC_High to 0), and the phase of the output signal So is opposite to that of the input signal Si.

If the phase of the output signal So needs to be set to be the same as the phase of the input signal Si, an inverter may be connected to the output terminal 122, which will not be repeated here in the present disclosure.

Figure 4C:
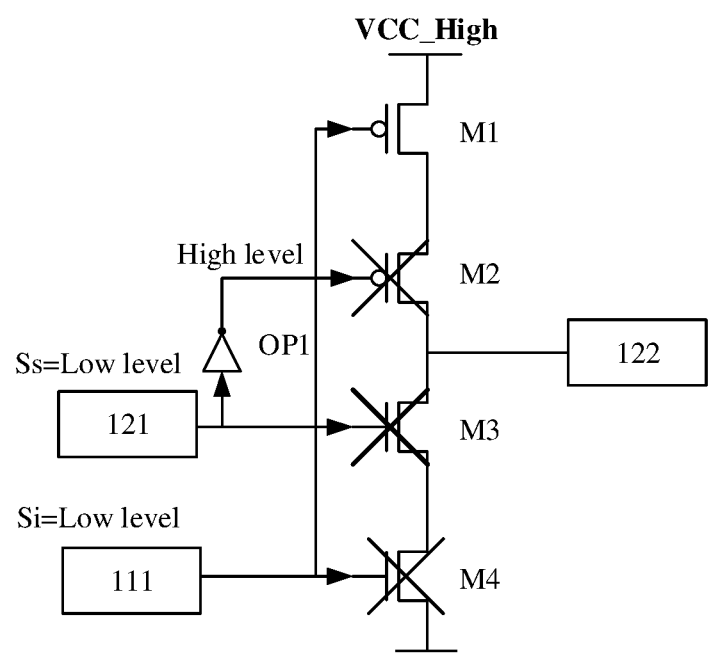
Figure 4D:
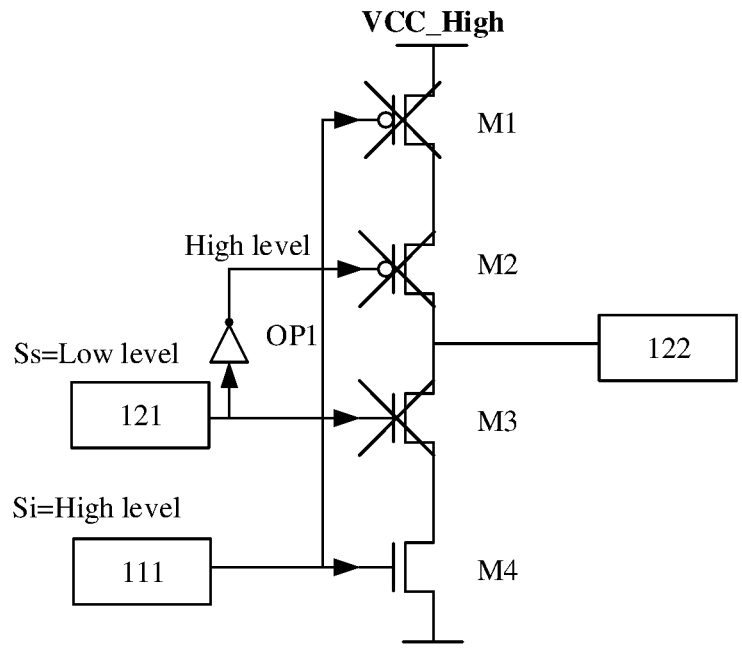

With reference to FIG. 4C and FIG. 4D, when the sampling signal Ss is at a low level, no matter what kind of signal the input signal Si is, no signal variation will be generated at the output terminal 122. In order to make the output signal So of the output terminal 122 have the same phase as the input signal Si, one way is to control, the sampling signal Ss to be always at a high level, and the second input module 12 can also be removed at this time, however, in this way, when the input signal Si is at a high level, the charging current I3 to the ground will continue to be generated, resulting in an increase in circuit power consumption. Another way is to connect a latch after the output terminal 122, so that when the sampling signal Ss is at a low level, the output signal of the entire circuit can still remain unchanged.

Figure 5:
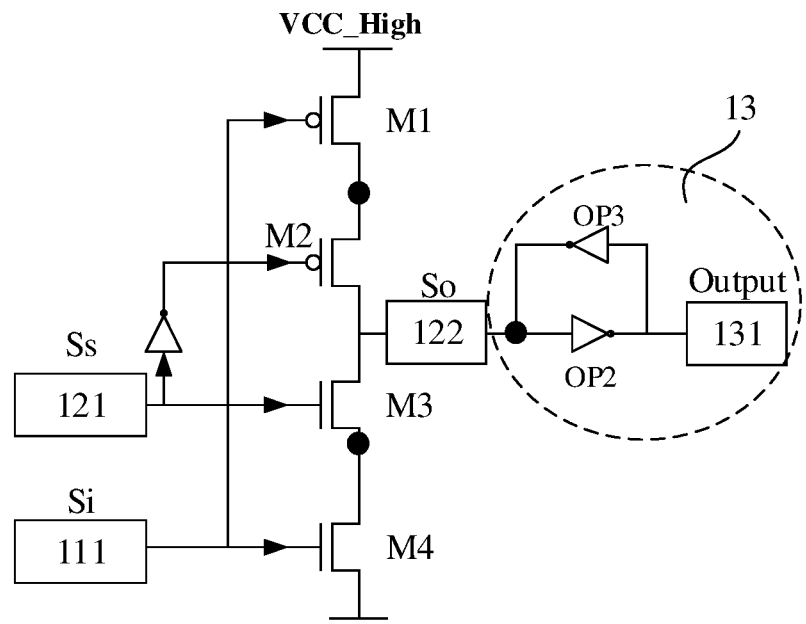
FIG. 5 illustrates a circuit diagram of a voltage conversion circuit in another embodiment of the present disclosure.

FIG. 5 illustrates a circuit diagram of a voltage conversion circuit in another embodiment of the present disclosure.

With reference to FIG. 5, in an exemplary embodiment of the present disclosure, the voltage conversion circuit 500 further include a latch module 13.

An input terminal of the latch module 13 is connected to the output terminal 122, and the latch module 13 is configured to latch the output signal So.

In the embodiment illustrated in FIG. 3, the latch module 13 includes a second inverter OP2 and a feedback inverter OP3. An input terminal of the second inverter OP2 is connected to an output terminal 122 of the voltage conversion circuit, and an output terminal of the second inverter may be connected to an output terminal 131 of the latch module 13; and an input terminal of the feedback inverter OP3 may be connected to an output terminal 131 of the latch module 13, and an output terminal of the feedback inverter OP3 may be connected to an output terminal 122 of the voltage conversion circuit. And both the second inverter OP2 and the feedback inverter OP3 are connected to the first voltage VCC_High, which is not illustrated in the figure.

Figure 6:
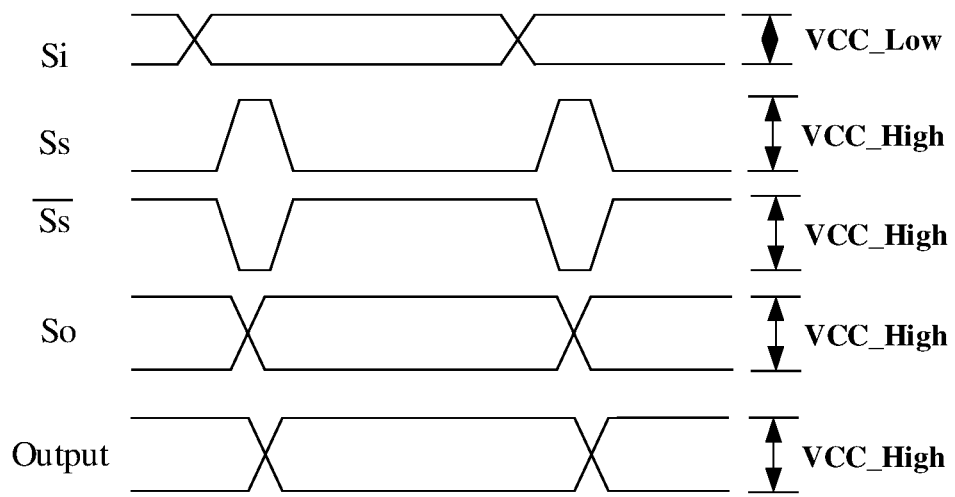
FIG. 6 illustrates a timing control diagram in the embodiment illustrated in FIG. 5.

FIG. 6 illustrates a timing control diagram in the embodiment illustrated in FIG. 5.

With reference to FIG. 6, compared with FIG. 3, the timing diagram of the output signal Output of the output terminal 131 of the latch module 13 is added in FIG. 6. The level variation of the output signal Output is later than the level variation of the output signal So due to the delay of the latch.

FIGS. 7A to 7D illustrate schematic diagrams of equivalent circuits of the voltage conversion circuit of the embodiment illustrated in FIG. 5 under the timing illustrated in FIG. 6.

Figure 7A:
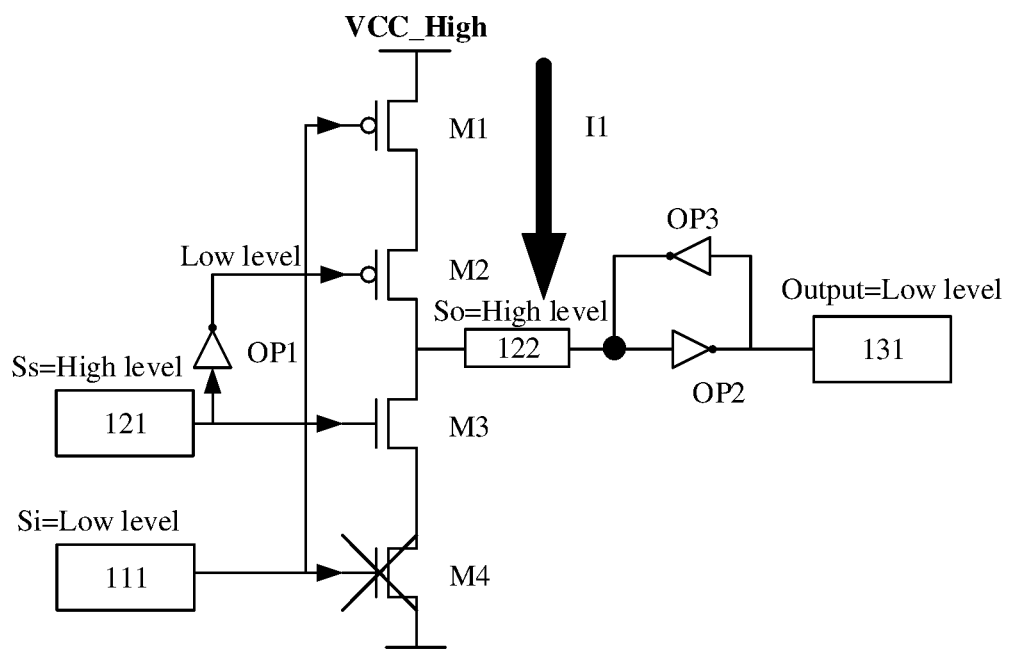
FIGS. 7A to 7D illustrate schematic diagrams of equivalent circuits of the voltage conversion circuit of the embodiment illustrated in FIG. 5 under the timing illustrated in FIG. 6.

With reference to FIG. 7A, when the input signal Si is at a low level and the sampling signal Ss is at a high level, the first P-type transistor M1, the second P-type transistor M2, and the first N-type transistor M3 are conducted, and the second N-type transistor M4 is turned off (or at least the pull-up capability of the first P-type transistor M1 is less than the pull-down capability of the second N-type transistor M4). At this time, the first voltage VCC_High is output to the output terminal 122 through the first P-type transistor M1 and the second P-type transistor M2 to generate the current I1, so that the output signal So is VCC_High, that is, the output signal So is at a high level.

The output signal So enters the second inverter OP2 and outputs a low-level output signal Output through the output terminal 131, and the phase of the output signal Output is synchronized with the phase of the sampling signal Ss. The output signal Output returns to the output terminal 122 via the feedback inverter OP3, and is still at a high level. Since the feedback inverter OP3 does not need to operate to maintain the voltage of the output terminal 122 at this time, in order to reduce power consumption, the feedback inverter OP3 can be controlled to be in a turned-off state in such a case.

Figure 7B:
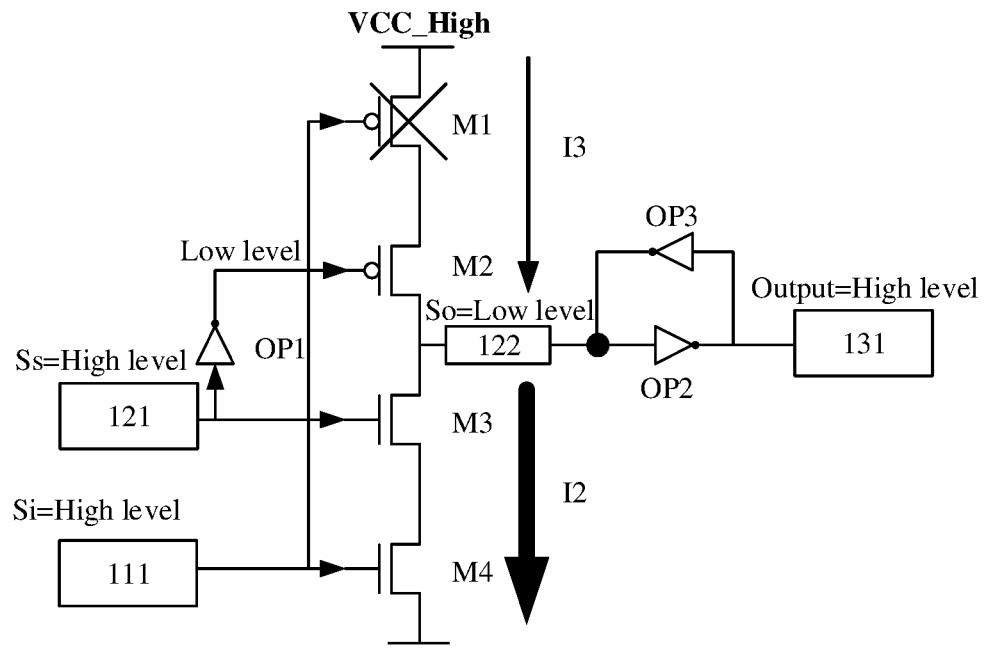

With reference to FIG. 7B, when the input signal Si is at a high level and the sampling signal Ss is at a high level, the second P-type transistor M2, the first N-type transistor M3, and the second N-type transistor M4 are conducted, and the first P-type transistor M1 is turned off. At this time, the output terminal 122 is grounded through the first N-type transistor M3 and the second N-type transistor M4, and the discharging current I2 is generated, so that the output signal So is 0, that is, the output signal So is at a low level. It can be understood that, since the high level of the input signal Si is VCC_Low, the first P-type transistor M1 may not be completely turned off, and there will be certain charging current I3.

The output signal So passes through the second inverter OP2 and an output signal Output having a high level is output through the output terminal 131, and the phase of the output signal Output is synchronized with the phase of the sampling signal Ss. The output signal Output returns to the output terminal 122 via the feedback inverter OP3, and is still at a low level. Since the feedback inverter OP3 does not need to operate to maintain the voltage of the output terminal 122 at this time, in order to reduce power consumption, the feedback inverter OP3 can be controlled to be in a turned-off state in such a case.

That is, when the sampling signal Ss is in an enabled state, the feedback inverter OP3 may be set in a turned-off state.

Figure 7C:
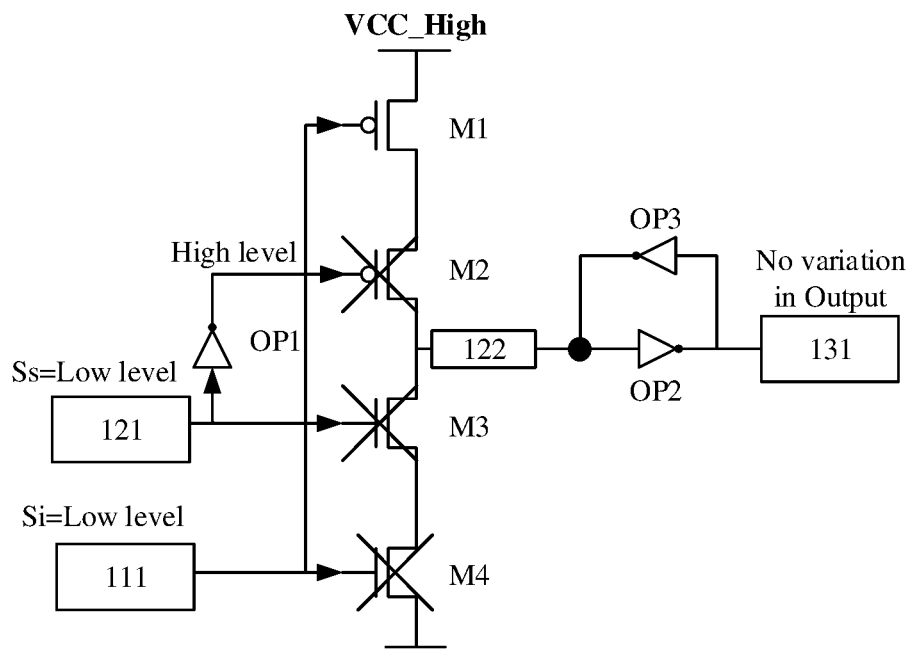
Figure 7D:
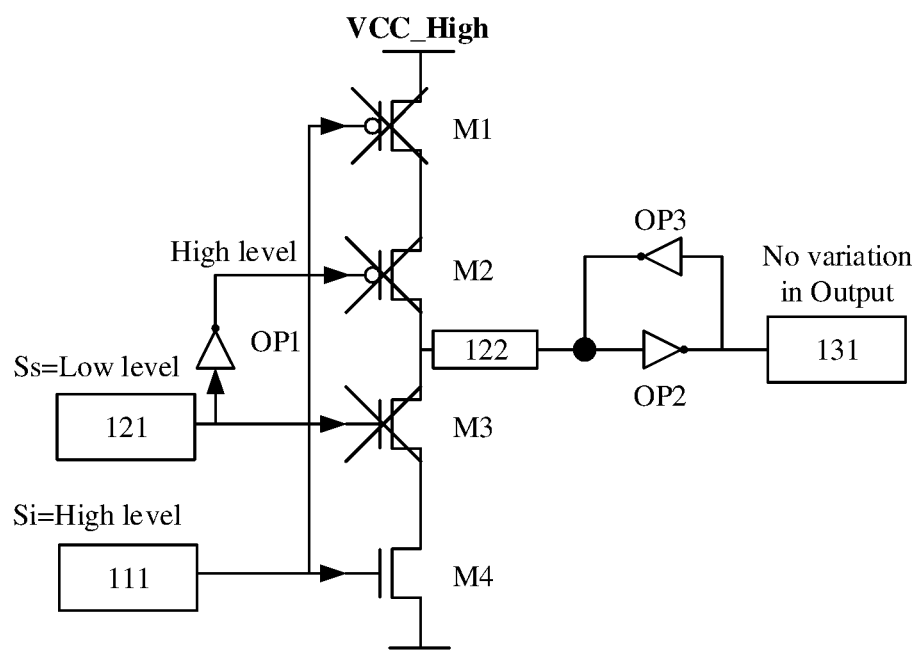

With reference to FIG. 7C, when the sampling signal Ss is at a low level, no matter what kind of signal the input signal Si is, no signal variation will be generated at the output terminal 122. Before this state is formed, that is, before the sampling signal Ss is controlled to be at a low level, the feedback inverter OP3 can be enabled to form a feedback path between the output terminal 122 and the output terminal 131. Since the second inverter OP2 and the feedback inverter OP3 are all active devices, the latch module 13 can maintain the voltage of the output terminal 122 when operating, and thus maintain the voltage of the output terminal 131 unchanged. The same applies to the embodiment illustrated in FIG. 7D, and details will not be repeated herein in the present disclosure.

Since the sampling signal Ss is in the enabled state and the input signal Si is at a high level, the charging current I3 will be generated, which increases power consumption, and when the latch module 13 is used to maintain the output signal unchanged, the time period during which the enabled state of the sampling signal Ss is maintained can be reduced as much as possible to reduce circuit power consumption.

In an embodiment of the present disclosure, when the enable level of the sampling signal Ss occurs within a preset time period during which the level of the input signal Si changes, the time period during which the enable level of the sampling signal Ss is maintained may be, for example, less than a half of the time period of the high level of the input signal Si.

In another embodiment of the present disclosure, when the sampling signal Ss is a pulse signal with a predetermined cycle, the duty ratio of the enable level in the sampling signal Ss may be, for example, less than ½. To further reduce power consumption, the duty cycle of the sampling signal Ss may be lower, for example, the duty cycle of the sampling signal Ss may be smaller than ¼, smaller than 1/10, or smaller than 1/20.

The above numerical values are only examples. In practical applications, a person skilled in the art can set the enable level maintaining time of the sampling signal Ss by himself/herself according to the actual situation.

Furthermore, by reducing the size of the components in the second input module 12, the charging current I3 can also be reduced.

The high level of the sampling signal Ss is VCC_High, and the low level is 0. The sampling signal Ss can be generated by a control circuit powered by VCC_High.

In the above embodiments of the present disclosure, by using a lower-voltage input signal Si to drive a transistor operating at a higher voltage, the lower-voltage input signal Si can be converted into a higher-voltage output signal So. By using the sampling signal to cooperate with the latch to realize the sampling and maintenance of the output signal So, the enable level maintaining time of the sampling signal can be greatly reduced, the generation of leakage current can be reduced, and furthermore, the power consumption of the entire circuit can be reduced. Compared with the prior art, the voltage conversion circuit provided by the embodiments of the present disclosure has fewer components, a small occupied area of the components, and low power consumption, and can be widely used in a circuit with a plurality of signal voltage conversion requirements.

In the embodiments of the present disclosure, the first input module is used to convert a lower-voltage input signal into a higher-voltage signal, and the second input module is used to sample the higher-voltage signal and then output it, such that a lower-voltage input signal can be converted to a higher-voltage output signal by using fewer components, thereby reducing the occupied area and power consumption of components in the process of voltage conversion.

It is to be noted that although several modules or units of the equipment for action performance are mentioned in the above detailed description, this division is not mandatory. Indeed, according to embodiments of the present disclosure, the features and functions of two or more modules or units described above may be embodied in one module or unit. Conversely, the features and functions of one module or unit described above may be further divided into a plurality of modules or units to be embodied.

A person skilled in the art would easily conceive of other implementations of the present disclosure upon consideration of the specification and practice of the present disclosure disclosed herein. The present disclosure is intended to cover any variations, uses, or adaptations of the present disclosure that follow the general principles of the present disclosure and include common sense or commonly-used techniques in the technical field not disclosed by the present disclosure. The specification and embodiments are to be regarded as exemplary only, with the true scope and spirit of the present disclosure being indicated by the claims.

The invention claimed is:

1. A voltage conversion circuit, comprising:
   a first input module, connected to a first voltage, and having a first input terminal for receiving an input signal and outputting a conversion signal, wherein a high level of the input signal is a second voltage which is less than the first voltage;
   a second input module, connected to the first input module, and having a second input terminal and an output terminal, wherein the second input terminal is configured to receive a sampling signal, and the second input module is configured to sample the conversion signal according to the sampling signal and output an output signal via the output terminal of the second input module; and
   a latch module, having an input terminal connected to the output terminal of the second input module, and configured to latch the output signal;
   wherein the latch module comprises:
      a second inverter, having an input terminal connected to an output terminal of the voltage conversion circuit, and an output terminal connected to an output terminal of the latch module; and
      a feedback inverter, having an input terminal connected to the output terminal of the latch module, and an output terminal connected to the output terminal of the voltage conversion circuit;
   wherein when the sampling signal is in an enabled state, the feedback inverter is in a turned-off state;
   wherein the first input module comprises:
      a first P-type transistor, having a gate connected to the first input terminal and a source connected to the first voltage; and
      a first N-type transistor, having a gate connected to the first input terminal and a source connected to a ground terminal;
   wherein a value of the second voltage is such that a pull-up capability of the first P-type transistor is less than a pull-down capability of the first N-type transistor.

2. The voltage conversion circuit of claim 1, wherein the second input module comprises:
   a second P-type transistor, having a gate electrically connected to the second input terminal, a source connected to a drain of the first P-type transistor, and a drain connected to the output terminal of the second input module; and
   a second N-type transistor, having a gate electrically connected to the second input terminal, a source connected to a drain of the first N-type transistor, and a drain connected to the output terminal of the second input module.

3. The voltage conversion circuit of claim 2, wherein the second input module further comprises a first inverter.

4. The voltage conversion circuit of claim 3, wherein an enable level of the sampling signal is a high level, the gate of the second P-type transistor is connected to the second input terminal via the first inverter, and the gate of the second N-type transistor is connected to the second input terminal.

5. The voltage conversion circuit of claim 3, wherein an enable level of the sampling signal is a low level, the gate of the second P-type transistor is connected to the second input terminal, and the gate of the second N-type transistor is connected to the second input terminal via the first inverter.

6. The voltage conversion circuit of claim 1, wherein an enable level of the sampling signal occurs within a preset time period during which a level of the input signal changes.

7. The voltage conversion circuit of claim 6, wherein a time period during which the enable level of the sampling signal is maintained is less than a half of a time period of the high level of the input signal.

8. The voltage conversion circuit of claim 1, wherein the sampling signal is a pulse signal with a predetermined cycle.

9. The voltage conversion circuit of claim 8, wherein a duty ratio of an enable level of the sampling signal is less than ½.

10. The voltage conversion circuit of claim 1, wherein a difference between the first voltage and the second voltage is less than or equal to a threshold voltage of the first P-type transistor.

\* \* \* \* \*